(12) United States Patent
Nakamura

(10) Patent No.: US 8,237,224 B2
(45) Date of Patent: Aug. 7, 2012

(54) METHOD OF MANUFACTURING A SEMICONDUCTOR DEVICE INCLUDING A HIGH VOLTAGE MOS AND THE SEMICONDUCTOR DEVICE MANUFACTURED BY THE METHOD

(75) Inventor: Ryo Nakamura, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 663 days.

(21) Appl. No.: 11/717,765

(22) Filed: Mar. 14, 2007

(65) Prior Publication Data

US 2007/0164328 A1    Jul. 19, 2007

Related U.S. Application Data

(62) Division of application No. 11/266,371, filed on Nov. 4, 2005, now Pat. No. 7,220,649.

(30) Foreign Application Priority Data

Nov. 12, 2004  (JP) ................................ 2004-328626

(51) Int. Cl.
    *H01L 21/02*   (2006.01)
(52) U.S. Cl. ................................ 257/344; 257/E29.266
(58) Field of Classification Search .................. 257/335, 257/336, 344–346, E21.431, 288, 404, E29.266, 257/E21.433
    See application file for complete search history.

(56) References Cited

U.S. PATENT DOCUMENTS

| 5,646,054 | A | 7/1997 | Rhee |
| 5,913,111 | A | 6/1999 | Kataoka et al. |
| 6,054,357 | A | 4/2000 | Choi |
| 6,146,982 | A | 11/2000 | Werner et al. |
| 6,278,160 | B1 | 8/2001 | Park et al. |
| 6,376,323 | B1 | 4/2002 | Kim et al. |
| 6,753,235 | B2 | 6/2004 | So et al. |
| 6,762,085 | B2 | 7/2004 | Zheng et al. |
| 6,951,793 | B2 | 10/2005 | Shih |
| 2002/0125531 | A1 | 9/2002 | Kikuchi et al. |
| 2005/0017301 | A1 | 1/2005 | Iwatsu et al. |

FOREIGN PATENT DOCUMENTS

| JP | A 8-172191 | 7/1996 |
| JP | A-11-26764 | 1/1999 |
| JP | A 2001-308197 | 11/2001 |
| JP | A-2001-326347 | 11/2001 |
| JP | A 2002-261276 | 9/2002 |

*Primary Examiner* — Matthew Landau
*Assistant Examiner* — Candice Chan
(74) *Attorney, Agent, or Firm* — Oliff & Berridge, PLC

(57) ABSTRACT

The method of manufacturing the semiconductor device that includes a high voltage MOS transistor with high operating voltage under both high and low gate voltages with low-cost is disclosed. When manufacturing the high voltage MOS transistor, a portion of a gate insulation film is removed to form an opening that exposes an outside area of the active area, which is outside of the central area where a gate electrode will be formed. A shallow grade layer is formed by implanting impurities into an opening with an energy that does not permit penetration of impurity ions through the gate insulation film.

8 Claims, 7 Drawing Sheets

METHOD OF MANUFACTURING A SEMICONDUCTOR DEVICE INCLUDING A HIGH VOLTAGE MOS AND THE SEMICONDUCTOR DEVICE MANUFACTURED BY THE METHOD

This is a Division of application Ser. No. 11/266,371 filed Nov. 4, 2005. The entire disclosure of the prior application is hereby incorporated by reference in its entirety.

INCORPORATION BY REFERENCE

This invention is first described in and claims priority from Japanese Application No. 2004-328626, which is incorporated by reference in its entirety.

BACKGROUND

The present invention relates to a method of manufacturing semiconductor devices having mask LDD (Lightly Doped Drain)-type high voltage MOS transistor with fewer manufacturing steps and the MOS transistor that is manufactured by the method. It particularly relates to a method of manufacturing semiconductor devices including high voltage MOS transistors whose maximum operating voltages are improved and the semiconductor devices that are manufactured by the method.

In order to drive a liquid crystal display device, for example, it is required that both low voltage MOS transistors which operate with a low power-supply voltage of, for example, 3.3V and high voltage MOS transistors which operate with a high power-supply voltage of, for example, 18V, are located on the same semiconductor substrate.

Among the above mentioned MOS transistors, a low voltage MOS transistor is, for example, formed in a well-known self-aligned LDD process as disclosed in reference 1. First, a gate insulation film is formed on a surface of an active area of a first conduction type in a surface of a semiconductor substrate, and a gate electrode is formed on the gate insulation film. Secondly, on both sides of the gate electrode, an LDD and lightly doped source layers are formed by implanting ions of impurities of a second conduction type at low concentration in a self-aligned process using gate electrode as a mask. Then, sidewall films are formed on sidewalls of the gate electrode, and the heavily doped source layer and heavily doped drain layer are then formed on the outside of the sidewall films by implanting ions of the impurities of the second conduction type at high concentration in a self-aligned process using the gate electrode and the sidewall films as a mask. In this method, the distance between the high concentration drain layer and the edge of the gate electrode is made equal to the width of the sidewall film.

On the other hand, it is necessary to make the gate insulation film of the high voltage MOS transistor thicker than that of the low voltage MOS transistor in order to improve the breakdown voltage between the gate and the source. Therefore, as disclosed in reference 1, a thick gate insulation film is formed first on the entire surface area of the semiconductor substrate by the thermal oxidation method, for example. The thick gate insulation film is then patterned by using a resist mask so that it is selectively removed in areas for forming low voltage MOS transistors. Then, the thin gate insulation film is formed again by a heat oxidation method, for example, in areas for forming low voltage MOS transistors.

For realizing a transistor with high breakdown voltage, it is also necessary to expand the distance between the gate electrode and the heavily doped drain layer to improve the breakdown voltage between the drain and the source. Therefore, for example, a structure of so-called "mask LDD" structure is utilized as disclosed in reference 1. In the "mask LDD" structure, heavily doped drain layer is formed with a certain distance apart from the gate electrode by implanting ions by using a resist mask. In this case, a low concentration layer whose conduction type is the same as the heavily doped drain layer is also formed between the edge of the gate electrode and the heavily doped drain layer, similar to the case of the LDD layer of the low voltage MOS transistor. Though this layer is named "high voltage area implanted by LDD" in reference 1, it is named a "grade area" in this specification.

However, there was a problem in that it was difficult to sufficiently increase the breakdown voltage ("breakdown voltage when operating" or "on-state breakdown voltage") of this type of conventional MOS transistor. The problem was that when the drain voltage increases, the difference between the drain current and the source current increases, and the transistor destructs. This phenomenon of destruction depends on the concentrations of impurities of the grade area. However, the phenomenon occurs in the area of high gate voltages when the concentration is low, and in the area of low gate voltages when the concentration is high. Therefore, it is difficult to increase the breakdown voltage in both areas at the same time.

On the other hand, reference 2 discloses a semiconductor device comprising: a gate electrode formed on one conductive type semiconductor substrate through a gate insulation film; a high concentration reverse conductive type source region adjacent to one end of said gate electrode; a low concentration reverse conductive type drain region formed facing said source region through a channel region; a high concentration reverse conductive type drain region separated from the other end of said gate electrode and included in said low concentration reverse conductive type drain region; and a middle concentration reverse conductive type layer at a region spanning at least from the position having the predetermined space from said gate electrode to said high concentration reverse conductive type drain region, and formed so that high impurity concentration becomes lower at a region near the gate electrode than near said high concentration reverse conductive type drain region.

Reference 3 discloses the high breakdown voltage MOS transistor comprising a semiconductor substrate; a gate insulation film formed on the semiconductor substrate; a gate electrode formed on the gate insulation film; and an impurity diffusion layer formed by overlapping low, medium and high concentration impurity layers on the semiconductor substrate of at least one side of the gate electrode. Reference 3 also discloses the manufacturing method of the high breakdown voltage MOS transistor.

Reference 1: Official Gazette of Japanese Patent No. 3473902
Reference 2: Official Gazette of Japanese Laid-open Patent No. 2002-261276 Reference 3: Official Gazette of Japanese Laid-open Patent No. 8-172191

References 2 and 3 disclose an improvement in the breakdown voltage by adding the middle concentration layer in addition to the grade layer and the heavily doped drain layer. (In each reference, it is called the "middle concentration reverse conductive type layer," and the "medium concentration impurity layers," respectively.)

However, the manufacturing processes disclosed in the above references require forming the resist pattern to determine the position of the middle concentration layer. Therefore, a different photo-mask would be required in order to form the middle concentration layer, when the methods of forming the gate insulation film of two kinds of thicknesses disclosed in reference 1 are combined, for example, and the high voltage MOS transistor and low voltage MOS transistor are formed on the same semiconductor substrate. Also, it would be necessary to perform an additional process in order to form the resist pattern by using this different mask. Therefore, these process steps would increase the manufacturing cost.

SUMMARY

An exemplary object of the present invention is to provide a manufacturing method of a semiconductor device including a high voltage MOS having a middle concentration that does not require a different photo-mask or an additional photo-mask process for forming the middle concentration layer. Another exemplary object of the present invention is to provide a semiconductor device including a high voltage MOS transistor manufactured by the method.

In order to solve the above-mentioned problems, an exemplary object of this invention is to provide methods to manufacture a semiconductor device containing a MOS transistor on a semiconductor substrate comprising forming a gate insulation film on a surface of an active area in a surface of said semiconductor substrate, the active area having a first conduction type, the active area further having a central area over which a gate electrode of the MOS transistor will be formed and an outside area outside of the central area; removing a portion of said gate insulation film so that an opening that exposes the outside area of the active area is formed; forming the gate electrode of the MOS transistor on said gate insulation film left on the central part of the active area; implanting first impurities of a second conduction type using said gate electrode as a mask with a first energy level that permits a penetration of ions of said first impurities through said gate insulation film so that a deep grade layer of the MOS transistor is formed in the surface of the active area, the deep grade layer extending from a gate edge right under an edge of the gate electrode to the outside area of said active area; implanting second impurities of the second conduction type into a part in said opening so that a drain layer of the MOS transistor is formed in the deep grade layer, the drain layer being doped heavier than said deep grade layer, the drain layer extending outwardly from a first edge which is positioned away from said gate edge; and implanting third impurities of said second conduction type into said opening with a second energy level that does not permit a penetration of ions of said third impurities through said gate insulation film so that a shallow grade layer of the MOS transistor is formed at least in a portion of the deep grade layer adjacent to the first edge of the drain layer, the shallow grade layer being lightly doped compared with said drain layer.

By the above mentioned process, the shallow grade layer, which corresponds to the middle concentration layer, can be formed by implanting the third impurities into the opening formed in the gate insulation film. Therefore, a different photo-mask is not required for forming the shallow grade layer and it is possible to manufacture the high voltage MOS transistor at low-cost.

It may be desirable that the implanting of both the first and third impurities are done in the condition that the same mask, which opens the first active area, be formed on the semiconductor substrate. Therefore, a separate mask process for forming the shallow grade layer is not required, and it is possible to manufacture the high voltage MOS transistor at lower cost.

Furthermore, it may be desirable that the implanting of the third impurities be done before the implanting of the second impurities, and both the implanting process of the second and the third impurities and the heating process after the implanting of the third impurities are done in the condition that the peak concentration of the impurities of the shallow grade area exists at a shallow position compared with the depth of the drain area in the completed semiconductor device.

Furthermore, it may be desirable that, after the removal of the gate insulation film, the second gate insulation film, that is thinner than the first gate insulation film, be formed on the surface of the opening surface of the active area and on the second active area of the first conductive type, and the second gate electrode is formed on the second gate insulation film in the second active area.

The process may further include the step of forming the second MOS transistor which has the second gate electrode, and the implantation of the third impurities is done at the energy level of penetrating the aforementioned second gate insulation film into the opening in which the second gate insulation film is formed.

In order to solve the above-mentioned problems, an exemplary object of this invention is to provide a semiconductor device containing a MOS transistor on a semiconductor substrate comprising a gate insulation film formed on a surface of an active area in a surface of said semiconductor substrate, the active area having a first conduction type; a gate electrode formed on said gate insulation film; a deep grade layer of a second conduction type formed in the surface of the active area, the deep grade layer extending outwardly from a gate edge right under an edge of the gate electrode; a drain layer of said second conduction type formed in a surface of the deep grade layer, the drain layer being doped heavier compared with said deep grade layer, the drain layer extending outwardly from a first edge positioned away from said gate edge; and a shallow grade layer of said second conduction type formed at least in a portion of the surface of the deep grade layer adjacent to the first edge of the drain layer, the shallow grade layer being lightly doped compared with the drain layer, the shallow grade layer increases a concentration of impurities of said second conduction type in the vicinity of the surface of said active area adjacent to the first edge of the drain layer compared with the concentration at the gate edge, wherein said gate insulation film is removed in an area corresponding to said shallow grade layer.

The structure, in which the gate insulation film is removed in the area corresponding to the shallow grade layer, is obtained by implanting the third impurities into the opening formed in the gate insulation film in the semiconductor device that forms the shallow grade layer with low-cost, as previously stated.

It may be further desirable to form a step, which makes the side of the shallow grade area lower, at the position corresponding to an edge of the gate of the shallow grade area on the surface of the active area.

In order to solve above-mentioned problems, an exemplary object of this invention is to provide a semiconductor device containing a MOS transistor formed using a manufacturing process on a semiconductor substrate comprising: a gate insulation film formed on a surface of an active area in a surface of the semiconductor substrate, the active area having a first conduction type; a gate electrode formed on the gate insulation film; a deep grade layer of a second conduction type formed in the surface of the active area, the deep grade layer extending outwardly from a gate edge right under an edge of the gate electrode; a drain layer of said second conduction type formed in a portion of the surface of said deep grade layer, the drain layer being doped heavier compared with said deep grade layer, the drain layer extending outwardly from a first edge positioned away from the gate edge; and a shallow grade layer of said second conduction type formed at least at a portion in the surface of the deep grade layer adjacent to the first edge of said drain layer, the shallow grade layer having a width not smaller than a design rule of the manufacturing process and being lightly doped compared with the drain layer, the shallow grade layer increases a concentration of impurities of said second conduction type in the vicinity of the surface of said active area adjacent to the first edge of the drain layer compared with the concentration at the gate edge, and a peak of the concentration of the impurities in said shallow grade layer locates at a shallower position than a depth of said drain layer.

As previously stated, the structure of the semiconductor device, whose peak concentration of the impurities of the aforementioned shallow grade area exists at the shallower position than the depth of the drain area, is obtained by implanting the third impurities into the opening formed in the gate insulation film, a MOS transistor with the shallow grade area changes into a high voltage one. Then, a minute and efficient low voltage MOS transistor is formed under the heat-treatment condition on the same semiconductor substrate with a high voltage MOS transistor.

Also, it may be further desirable on the surface of the second active area of the first conductive type of the semiconductor substrate to have the second MOS transistor that has the second gate electrode formed through the second gate insulation film that is thinner than the gate insulation film in addition to the MOS transistor.

DETAILED DESCRIPTION OF EMBODIMENTS

Figure 1:
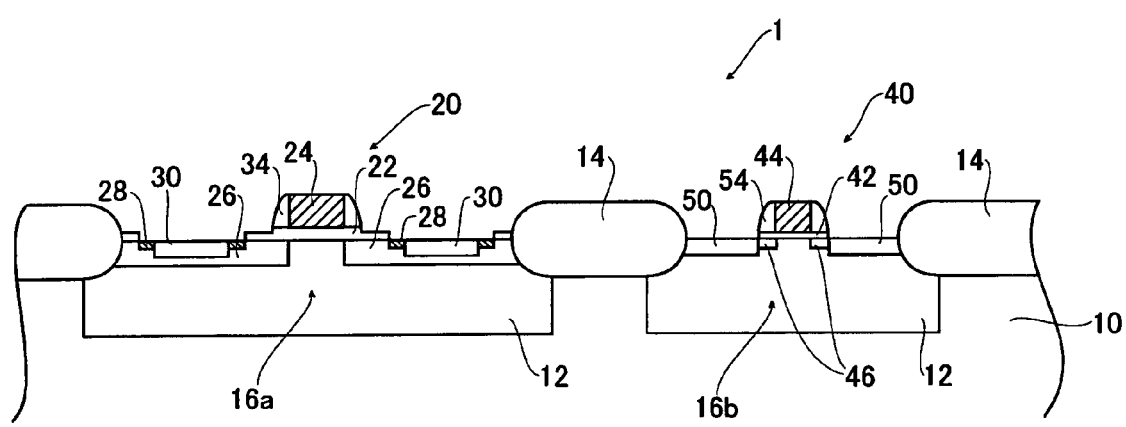
FIG. 1 is a cross sectional view of one example of the semiconductor device of the present invention, in which a high voltage MOS transistor and a low voltage MOS transistor are formed on the same semiconductor substrate.

FIG. 1 is a cross sectional view of a part of the exemplary semiconductor device 1, according to the present invention, in which a high voltage MOS transistor and a low voltage MOS transistor are formed on the surface of the same semiconductor substrate. An N-channel high voltage MOS transistor 20 is shown at the left of FIG. 1 and an N-channel low voltage MOS transistor 40 is shown on the right side. The semiconductor device 1 may be a CMOS type semiconductor device that also has a P-channel high voltage MOS transistor and a P-channel low voltage MOS transistor. The following descriptions are for the CMOS type semiconductor device.

According to various exemplary embodiments, a P-type well 12 and an N-type well, which is not shown in the figure, are formed on the surface of a semiconductor substrate 1. A field isolation film 14 is formed at a certain position in the surface of semiconductor substrate 1. Thereby, the surface of the semiconductor substrate is divided into active areas 16 to form MOS transistors. N-channel MOS transistors may be formed in the active areas in the P-type wells 12, and P-channel MOS transistors may be formed in the active areas in the N wells. Two active areas 16a and 16b formed in each P-type well 12 are shown in FIG. 1. An N-channel high voltage MOS transistor 20 is formed in the first active area 16a at the left side of the figure and a N-channel low voltage MOS transistor 40 is formed in the second active area 16b at the right side of the figure.

According to various exemplary embodiments, the low voltage MOS transistor 40 may have a second gate electrode 44, LDD layers 46, high concentration source and drain layers 50. The second gate electrode 44 is formed on the surface of the second active area 16b in the P-type well 12 through the second gate insulation film 42. The second gate insulation film 42 may have, for example, a thickness of 7 nm for the device with the design rule of 0.35 μm when a silicon oxide film is used as the second gate insulation film. Sidewall films 54 of silicon oxide, for example, may be formed on both sides of the second gate electrode 44. The low voltage MOS transistor 40 of the semiconductor device 1 may be the same as a conventional LDD type MOS transistor. Therefore, a detailed explanation is unnecessary.

According to various exemplary embodiments, the high voltage MOS transistor 20 has a first gate electrode 24, a deep grade layer 26, a shallow grade layer 28 and a high concentration source and drain layers 30. The first gate electrode 24 is formed of, for example, a poly-silicon or of a stack of a metal silicide layer on a poly-silicon layer. The first gate electrode 24 is also formed on the first gate insulation film 22 on the surface of the first active area 16a. The thickness of the first gate insulation film 22 is 44 nm, for example, for the device having the breakdown voltage of 18V when a silicon oxide film is used as the first gate insulation film.

According to various exemplary embodiments, the deep grade layers 26 may be formed with a specified depth within the first active area 16a and extend outwardly from the positions right under both ends of the gate electrode 24 (i.e., gate edge). The shallow grade layers 28, and the high concentration source and drain layers 30 may be formed vertically and horizontally within the respective deep grade layers 26. That is, the shallow grade layers 28, and the high concentration source and drain layers 30 may be formed in the surface of the respective deep grade layers 26, which may be formed in the surface of the first active area 16a. Also, the depth of either shallow grade layers 28, and the high concentration source and the drain layers 30, are more shallow than that of the deep grade layer 26.

According to various exemplary embodiments, the sidewall films 34 of silicon oxide, for example, may be formed on the sidewalls of the first gate electrode 24. They are formed simultaneously in the process of forming the sidewall films 54 of the low voltage MOS transistor 40 on the same semiconductor substrate. The sidewall films 34 are not indispensable to the operation of the high voltage MOS transistor 20.

An exemplary manufacturing process of the semiconductor device according to the present invention is hereafter explained.

FIGS. 2 through 10 show the cross sectional view of the structure in each steps of an exemplary manufacturing process of the semiconductor device. In these figures, the same symbols are commonly used to the same components shown in the cross sectional view of FIG. 1.

Figure 2:
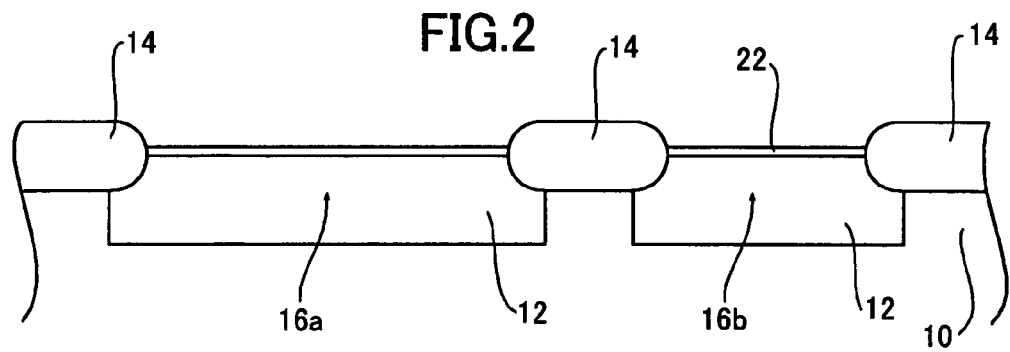
FIG. 2-10 are cross sectional views of one example of the manufacturing process regarding the semiconductor device of the present invention.

According to various exemplary embodiments, P wells 12 and N-type wells, which are not shown in the figure, may first be formed at specified positions in the surface of a semiconductor substrate 10, as shown in FIG. 2, by conventional ion implantation and thermal diffusion processes. In addition, field isolation films 14 are formed at specified positions in the surface of the semiconductor substrate 1 with, for example, the LOCOS (LOCal Oxidation of Silicon) method, for example. FIG. 2 shows the state where the field isolation films 14 are formed at the center part and both right and left ends in the figure. The area surrounded by the field isolation film at the center area and the field isolation film in the left area becomes the first active area 16a for forming the high voltage MOS transistor. On the other hand, the area enclosed by the field isolation film at the center and the field isolation film on the right is the second active area 16b where a low voltage MOS transistor is formed. Also the first gate insulation film 22 is formed by a thermal oxidation method, for example, on the surface of these active areas 16a and 16b at the same time. The first gate insulation film 22 thus becomes the gate insulation film of the high voltage MOS transistor.

Figure 3:
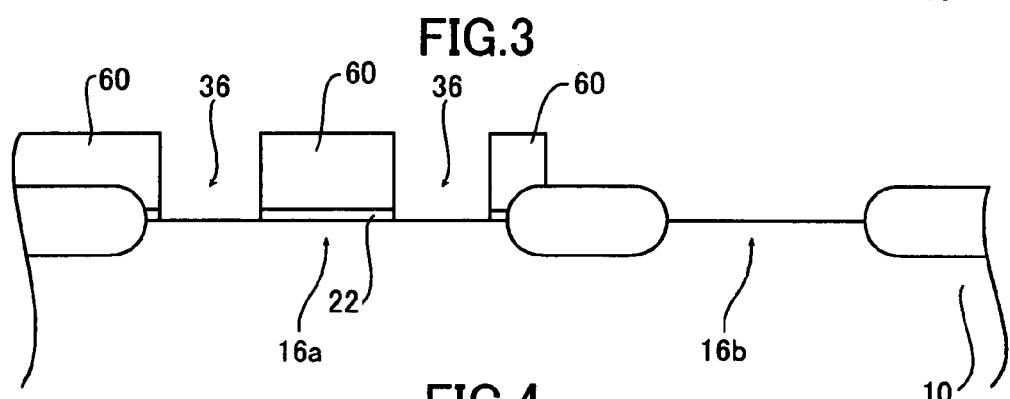

Next, as shown in FIG. 3, a resist pattern 60, which covers the central part of the first active area 16a, is formed over the surface of the semiconductor substrate 10 by a conventional photolithography method. The resist pattern 60 is used as a mask and the first gate insulation film 22 is removed. As a result, the surface of semiconductor substrate 10 is exposed in the entire second active area 16b. On the other hand, the first gate insulation film 22 is patterned on the first active area 16a so that it is left in a central part. Also the opening 36 is formed at both sides of the first gate insulation film 22 where the surface of semiconductor substrate 10 is exposed. Subsequently, the gate electrode of the high voltage MOS transistor (the first gate electrode) is formed on the first gate insulation film 22, which is being left on the central part of the first active area 16a. That is, the first gate insulation film 22 is patterned so that it is left in the central region of the first active area 16a where the gate electrode is to be formed. However, the first gate insulation film 22 is left or patterned in a size that is bigger than the minimum size in order to form the gate electrode and to provide a margin for the alignment error. The size of the patterned first gate insulation film determines the distance between the gate edge and the shallow grade area 28 in the later processes. The P-type well is omitted in FIG. 3 and in the figures thereafter.

Figure 4:
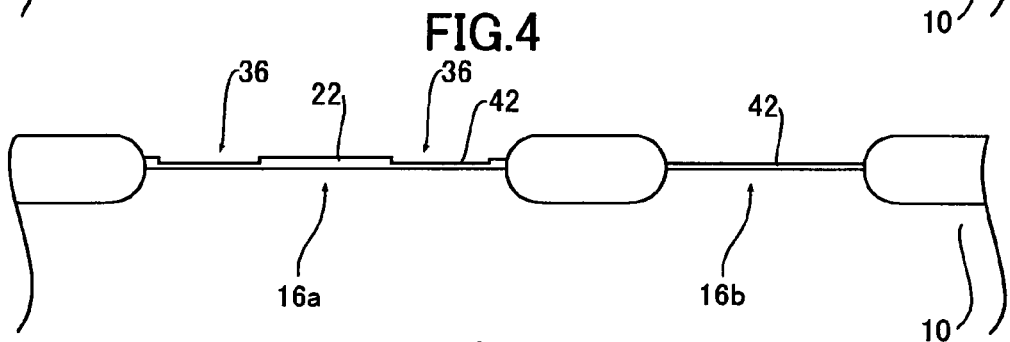

Next, as shown in FIG. 4, the resist pattern 60 is removed, and the second gate insulation film 42, which becomes the gate insulation film of the low voltage MOS transistor, is formed by a thermal oxidation method, for example, on the entire surface of the second active area 16b, where the surface of the semiconductor substrate 10 is exposed by removing the first gate insulation film 22, and on the surface of the first active area 16a exposed in the opening 36.

According to various exemplary embodiments, the second gate insulation film 42 is formed by the oxidation of the surface of the semiconductor substrate 10 that had been exposed in FIG. 3, when the second gate insulation film 42 is formed with the thermal oxidation method. Therefore, portions of the surface of the semiconductor substrate 10, which are exposed at the step shown in FIG. 3, lower with an amount of about ½ of the thickness of the second gate insulation film 42. That is, although not shown in FIG. 4, a step is formed on the surface of the semiconductor substrate 10 at the edge of the opening 36.

Figure 5:
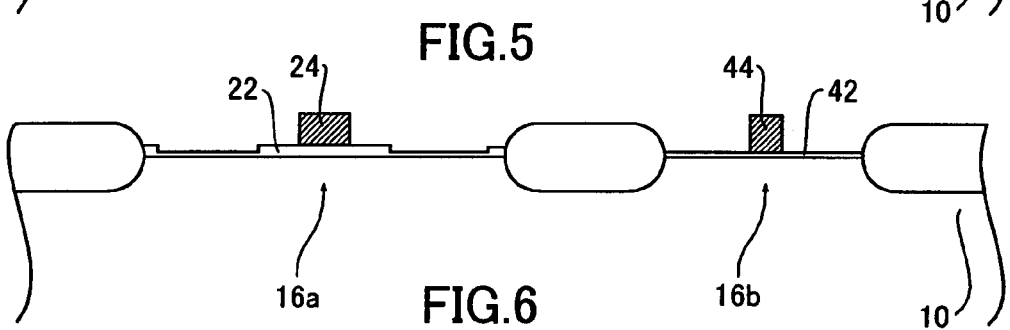

Thus, the first gate insulation film 22 and the second gate insulation film 42 are formed on entire surface of the semiconductor substrate 10. Next, a poly-silicon film is deposited and patterned by the photolithography method, for example. Thereby, the first gate electrode 24 is formed on the first gate insulation film 22 and the second gate electrode 44 is formed on the second gate insulation film 42 as shown in FIG. 5.

Figure 6:
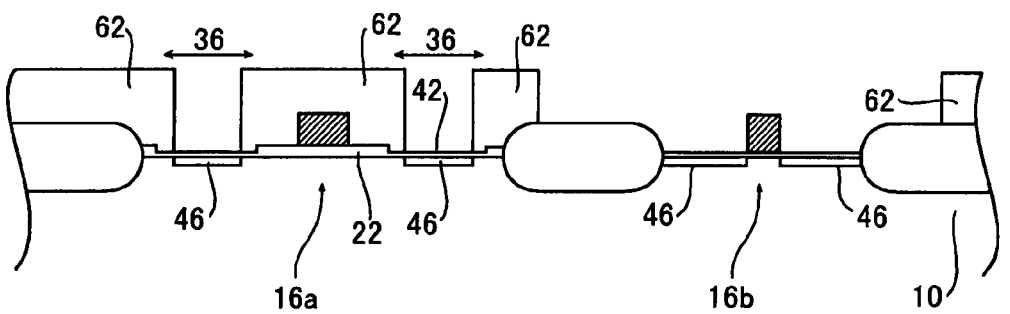

Next, according to various exemplary embodiments, a resist pattern 62 is formed over the surface of the semiconductor substrate 10 as a mask for ion implantation as shown in FIG. 6. The resist pattern 62, exposes the entire surface of the second active area 16b exposed. In the first active area 16a, the resist pattern 62 covers the first gate insulation film 22 left in the central portion of the first active area 16a, and also covers the outside area apart from the central portion with a specified distance. Thus, parts of the opening 36 are exposed. Implantation of N-type impurities, such as phosphorus, forms LDD layers 46 of the low voltage MOS transistor in the second active area 16b. This is the same process as in the conventional manufacturing process of the low voltage MOS transistor. The implanting conditions can be decided similarly to the conventional process conditions.

Figure 9:
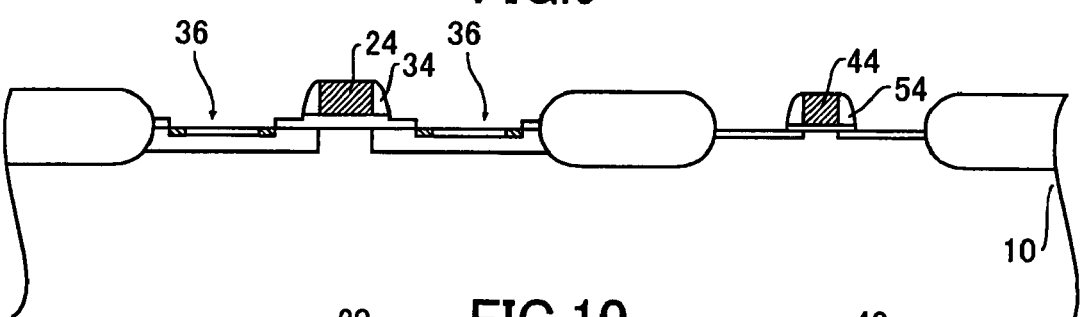
Figure 10:
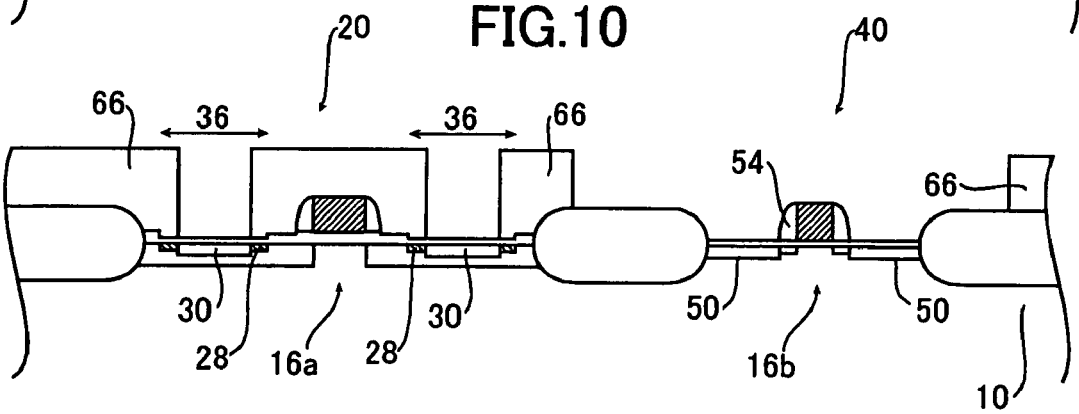

At this time, LDD layers 46 are formed in the first active area 16a at the same time. Here, it is not indispensable to form the LDD layers 46 in the first active area 16a. In the exemplary manufacturing method shown in FIGS. 2 through 10, however, the LDD layers 46 are also formed in the first active area 16a in order to minimize the number of masks used for the manufacturing. That is, the same mask used in the step for forming the heavily doped source and drain layers shown in FIG. 10 is used in the step shown in FIG. 6 to form the resist pattern 62.

The process shown in FIG. 6 forms the LDD layers 46 of the N-channel low voltage MOS transistor. At this time, the area where the P-channel MOS transistor is formed is covered with the resist pattern 62. Also, the process for forming the LDD layers of the P-channel low voltage MOS transistor, which is not shown in the figure, is also made.

According to various exemplary embodiments, the LDD layers in the MOS transistor after the completion of the manufacturing of the semiconductor device are formed not only by the ion implantation process shown in FIG. 6, but also by the diffusion in the heat-treatment afterwards. In the present embodiment, it is simply expressed as "formed by implanting impurities" to mean that various impurity diffusion layers are formed by impurity implantation and thermal diffusion processes.

Figure 7:
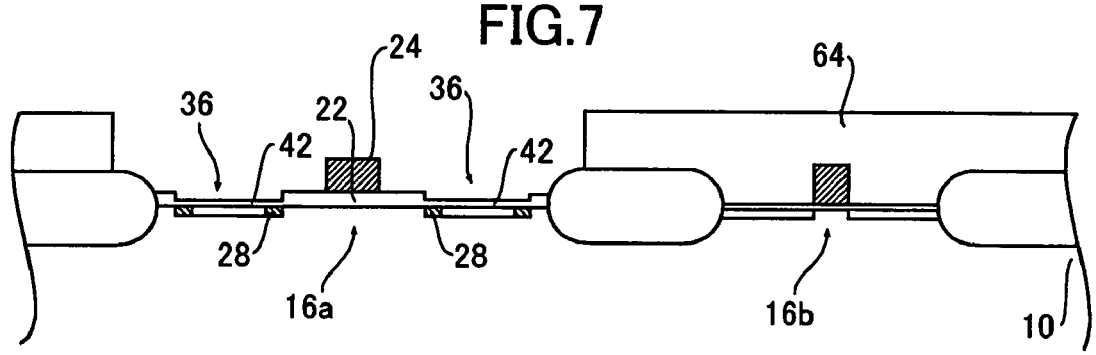

Next, according to various exemplary embodiments, a resist pattern 64 is formed over the surface of the semiconductor substrate 10 as a mask for the ion implantation as shown in FIG. 7 after the resist pattern 62 is removed. The resist pattern 64 covers the entire surface of the second active area 16b, and exposes the entire surface of the first active area 16a. Implanting N-type impurities, such as phosphorus, forms the shallow grade layers 28. The ion implantation of this step is performed with an energy level which permits penetration of the impurities though the second gate insulation film 42 formed in the opening 36, but does not permit penetration of the impurities through the first gate insulation film 22 left on the center part of the first active area 16a. That is, the patterned first gate insulation film is used as a mask, and the impurities are implanted into the opening 36 to form the shallow grade layers 28.

As a result, the shallow grade layers 28 are formed in the opening 36 as a self-aligned manner. Therefore, the shallow grade layers 28 are formed at the positions away from the first gate electrode 24 with a specified distance. The mask that forms the opening 36 in FIG. 3 and the mask that forms the first gate electrode 24 in FIG. 5 determine the distance.

For example, when the first gate insulation film 22 is a silicon oxide film with a thickness of 44 nm, the film thickness of the second gate insulation film 42 is 7 nm, and phosphorus is implanted, for example, the implantation energy is adjusted to be 15-5 keV. For example, the dose is $0.5\text{-}2\times10^{12}$ cm$^{-2}$.

Figure 8:
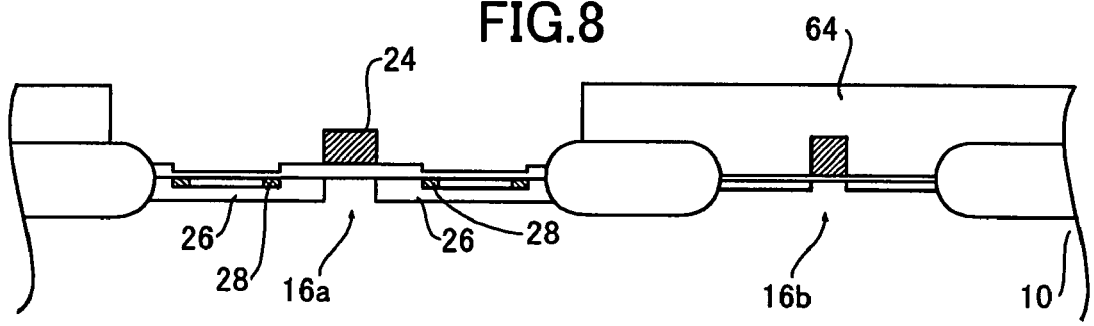

Next, according to various exemplary embodiments, N-type impurities, such as phosphorus, are implanted using the same resist pattern 64 left as shown in FIG. 8 as a mask. In this implantation step, the first gate electrode 24 is used as a mask. That is, the condition is adjusted that permits penetration of the impurities through the first gate insulation film 22, but does not permit penetration through the first gate electrode 24. For example, when the first gate insulation film 22 is a silicon oxide film with a thickness of 44 nm and phosphorus is implanted, the implanting energy is adjusted to be 100-150 keV. For example, the dose is adjusted to be $3\text{-}10\times10^{12}$ cm$^{-2}$. As a result, the deep grade layers 26 are formed in a self-aligned manner to the gate electrode 24.

The shallow grade layers 28 and the deep grade layers 26 of the N-channel high voltage MOS transistor are formed in the process shown in FIGS. 7 and 8. At this time, the area where the P-channel MOS transistor is formed is covered with the resist pattern 64. Also, the deep grade layers and, if necessary, the shallow grade layers of the P-channel high voltage MOS transistor, which are not shown in the figure, are further formed. However, it is not usually necessary to form the shallow grade layer for the P-channel high voltage MOS transistor, when the required breakdown voltage is about 18V. After this process, a heat-treatment is done to activate the impurities, which are implanted to form the LDD layers 46, the shallow grade layers 28 and the deep grade layers 26, if necessary.

According to various exemplary embodiments, after the resist pattern 64 is removed, a silicon oxide film is deposited over the whole surface of the semiconductor substrate 10 by a CVD method, for example, and an anisotropical dry etching is performed. Thus, the sidewall films 34 and 54 are formed on the sidewalls on both sides of the first gate electrode 24 and the second gate electrode 44 as shown in FIG. 9. The surface of the semiconductor substrate 10 is exposed in the openings 36 by the overetching during the dry etching for forming the sidewall films. The surface of the semiconductor substrate 10 is also exposed by the overetching at outside of the sidewall films 54 on both sides of the gate electrode 44 in the second active area 16b. Moreover, the thickness of the second gate insulation film 42, which is left outside of the sidewall films on both sides of the first gate electrode 24, decreases during overetching. It is possible to activate the impurities during a heat-treatment for annealing the silicon oxide film after silicon oxide film for the side wall is formed. For example, this heat-treatment can be performed at 950-1050° C. for 15-120 seconds.

Next, according to various exemplary embodiments, a resist pattern 66 is formed over the surface of the semiconductor substrate 10 as a mask for the ion implantation as shown in FIG. 10. The resist pattern 66 exposes the entire area of the second active area 16b and parts of the openings 36 in the first active area 16a. That is, the resist pattern 66 covers the central part of the first active area 16a where the first gate insulation film is left and further extends outwardly to a certain distance. Heavily doped source and drain layers 30 of the high voltage MOS transistor are also formed in the first active area 16a by implanting N-type impurities, such as, for example, arsenic. Simultaneously, heavily doped source and drain layers 50 of the low voltage MOS transistor are formed in the second active area 16b. The implanting energy is 35-75 keV, for example, and the dose is $2\text{-}5\times10^{15}$ cm$^{-2}$, for example. As a result, heavily doped source and drain layers 30 are formed at positions in the openings 36 determined by the resist pattern 66. That is, the heavily doped source and drain layers 30 are formed at the positions further away from the first gate electrode compared with the shallow grade area 28.

According to various exemplary embodiments, the heavily doped source and drain layers 30 and 50 of the N-channel high voltage MOS transistor 20, and the N-channel low voltage MOS transistor 40 are formed in the process shown in FIG. 10. The areas where P-channel MOS transistors are formed are covered with resist pattern 66. Also, the heavily doped source and drain layers of P-channel MOS transistors are formed, which are not shown in the figure. Next, a heat-treatment is performed in order to activate the implanted impurities. For example, the heat-treatment for activating the impurities is performed after depositing an interlayer dielectric film that insulates the high voltage MOS transistor 20 and the low voltage MOS transistor 40 from wirings that will be formed on the interlayer dielectric film. That is, the heat-treatment is performed for the purposes of activating the implanted impurities and to anneal the interlayer dielectric film. The heat-treatment for this process is performed at 700-900° C. for 15-60 minutes, for example. The implanted impurities are activated and diffuse vertically and horizontally during the heat-treatment. As a result, the formation of the deep grade layers 26, the shallow grade layers 28 and the heavily doped source and drain layers 30 and 50 are completed. Each of them has its own impurity distributions.

In the manufacturing process explained above, the openings 36 are formed in the first active area 16a in the step to remove the first gate insulation film formed in the second active area 16b. Implanting impurities in these openings 36 forms the shallow grade layers 28. Therefore, a different photo-mask for forming the shallow grade layers is not required. Moreover, the ion implantation for forming the shallow grade layers 28 is performed with the resist mask 64 formed over semiconductor substrate 10. Also, the resist mask 64 is the same as the one used for the ion implantation for forming the deep grade layer 26. Therefore, a separate mask process for the shallow grade layers is not required.

In the manufacturing process explained above, it is not necessary to use a different photo-mask or a separate mask process in order to form the shallow grade layer 28. Therefore, it is possible to manufacture a semiconductor device that has a high voltage MOS transistor with a high maximum operating voltage at low cost, which is almost equal to the case in which the shallow grade layers 28 are not formed. However, the manufacturing process of the semiconductor device of the present invention is not limited to the aforementioned example. For example, according to various exemplary embodiments, it is also possible to implant the ions for forming the shallow grade layers by forming the same resist mask over the semiconductor substrate 10 as the resist mask 64 for forming the deep grade layers after forming the sidewall films 34. In this case, a separate mask process is required for forming the shallow grade layers 28, which leads to a higher cost compared with the processes shown in FIGS. 2 through 10.

However, even in this case, it is not necessary to use a different photo-mask for forming the shallow grade layers 28 by implanting the impurities into the openings 36 at an energy level that does not permit the penetration of the impurities through the first gate insulation film 22. That is, the resist pattern for forming the shallow grade layers 28 can be formed by using the same photo-mask as that for forming the resist mask 64 for forming the deep grade layers 26 in the process in FIG. 8. Therefore, the cost of manufacturing of the present invention remains lower than the conventional cases, which require a different photo-mask. Thus, the process by which the high voltage MOS transistor 20 and the low voltage MOS transistor 40 are formed on the same semiconductor substrate 10 is completed. Manufacturing of an exemplary semiconductor device 1 having the high voltage MOS transistor 20 and the low voltage MOS transistor 40 according to the present invention is also completed after the steps for forming the wirings between these transistors. Next, the structure of the high voltage MOS transistor that composes the semiconductor device according to an exemplary embodiment of the present invention is further explained in detail by reference to FIG. 11.

Figure 11:
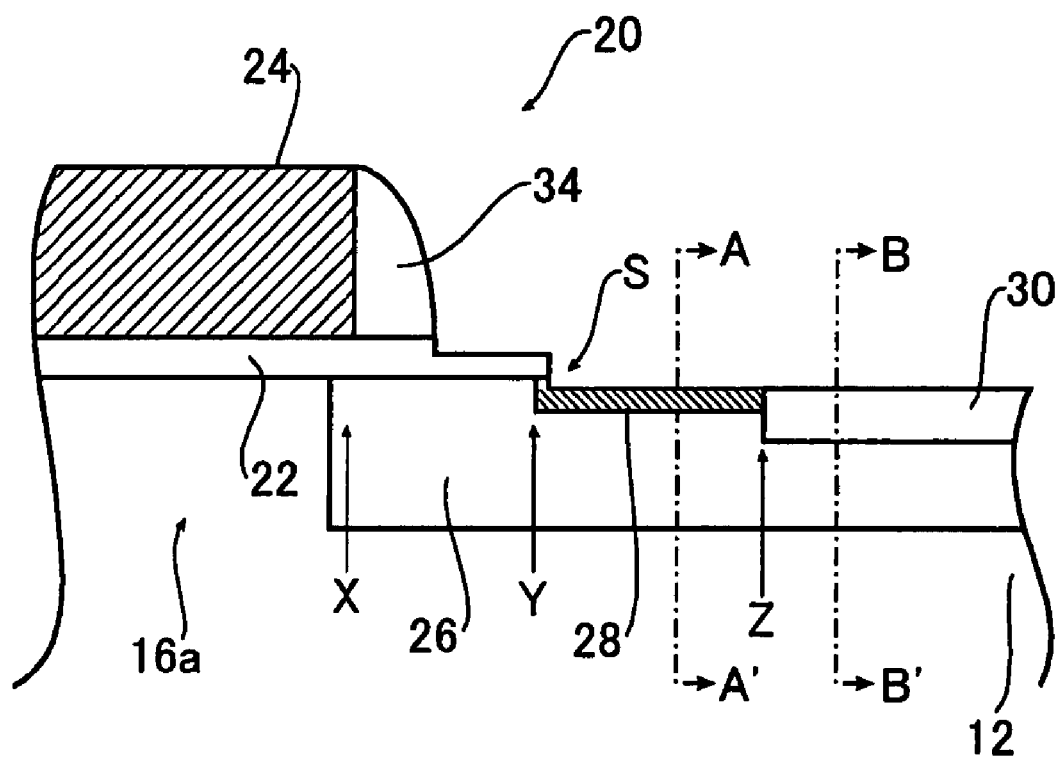
FIG. 11 is a partly enlarged cross sectional view of the detailed structure of the high voltage MOS transistor that composes the semiconductor device of the present invention.

FIG. 11 is an enlarged partial cross sectional view of an exemplary high voltage MOS transistor 20 where the relationship among the deep grade layer 26 on the drain side, the shallow grade layer 28 and the heavily doped drain layer 30 is shown. In FIG. 11, high voltage MOS transistor 20 has a symmetric structure with the source side, i.e., left side of the figure and the drain side, i.e., right side of the figure. Therefore, only the structure of the drain side is shown in FIG. 11, and that of the source side is omitted.

First, deep grade layer 26 is formed with a specified depth from the position X (gate edge) right under one end of the gate electrode 24 (on the right side of the figure) to the outside area in the surface of the first active area 16a, which is the surface layer of the P-type well 12 in which P-type impurities, for example, boron are doped. The gate electrode 24 is used as a mask, and implanting impurities forms the deep grade layer 26 self-aligned manners with the gate electrode 24. That is, the deep grade layer 26 is formed so that one end of the layer (at the left side of FIG. 11) nearly aligns with the gate edge X. However, strictly speaking, the deep grade layer 26 extends under the gate electrode 24 because the impurities diffuse horizontally by the heat-treatment after the implantation. The deep grade layer 26 contains N-type impurities (for example, phosphorus) with the concentration of $1\text{-}3 \times 10^{17}$ cm$^{-3}$, for example. Also, the deep grade layer 26 has a depth of 0.3 µm, for example. That is, the depth where the concentration of the N-type impurities becomes equal to the concentration of the P-type impurities of the P-type well 12.

According to various exemplary embodiments, the heavily doped drain layer 30 is formed in the deep grade layer 26, and contains N-type impurities (for example, arsenic) with the concentration of about $1 \times 10^{20}$ cm$^{-3}$ or more in the vicinity of the surface, and the heavily doped drain layer 30 has the depth of 0.2 µm or less, for example. That depth is where the concentration of arsenic becomes equal to the concentration of the P-type impurities of the P-type well. The heavily doped drain layer is formed a certain distance away from the gate edge X, which is necessary to obtain the required breakdown voltage between the drain and the source. That is, the heavily doped drain layer 30 extends outwardly from a first edge Z, which is one of the edges of the heavily doped drain layer 30 at the side of the gate edge X, and the first edge Z is positioned a specified distance away (for example, 1-2 µm) from the gate edge X.

The shallow grade layer 28, which characterizes the high voltage MOS transistor 20 of the exemplary semiconductor device according to the present invention, is formed at least in a portion of the surface of the deep grade layer 26 adjacent to the first edge Z of the heavily doped drain layer 30. That is, the shallow grade layer 28 is formed at least from a middle point Y, which is a specified distance away from the gate edge X and is located between the gate edge X and the first edge Z of the heavily doped drain layer 30, to the first edge Z of the heavily doped drain layer 30 facing to the gate edge X. The distance from the gate edge X to the middle point Y is, for example, 0.3-1.0 µm.

The peak concentration of the N-type impurities (for example, phosphorus) in the shallow grade layer 28 is for example, $2\text{-}5 \times 10^{17}$ cm$^{-3}$. The peak concentration is higher than that of the deep grade layer 26, and is lower than the concentration of the impurities in the heavily doped drain layer 30. As a result, the concentration of N-type impurities in the vicinity of the surface of the first active area 16a adjacent to the first edge Z of the heavily doped drain layer 30 is higher than that at the gate edge X. That is, the shallow grade layer 28 corresponds to the middle concentration layer disclosed in references 1 and 2.

The shallow grade layer 28 makes it possible to lower the concentrations of the impurities of the deep grade layer 26, keep the maximum operating voltage high at low gate voltages. At the same time, the shallow grade layer 28 also makes it possible to increase the concentrations of the impurities at the area adjacent to the first edge Z of the heavily doped drain layer 30 at the side of the gate edge X and increases the maximum operating voltage at high gate voltages. The width of the area where the impurity concentration is increased, that is, the width of the shallow grade layer 28 formed between the gate edge X and the first edge Z of the heavily doped drain area 30 (i.e., distance from Y to Z in FIG. 11), is, for example 0.3-1.5 µm.

In the manufacturing process shown in FIGS. 2 through 10, the impurities are implanted to the whole area of the opening 36 in the process shown in FIG. 7 in order to form the shallow grade layer 28. Therefore, although omitted in FIG. 11, the shallow grade layer 28 may also be formed in the area overlapping the heavily doped drain layer 30, and further extends to the other side of the heavily doped drain area 30. However, it is the portion of the shallow grade layer 28 formed adjacent to the first edge Z that plays a main role to the characteristics of the high voltage MOS transistor of the exemplary semiconductor device according to the present invention. In the exemplary structure shown in FIG. 11, the portion of the shallow grade layer 28 formed on the left side of the first edge Z of the heavily doped drain layer 30 (i.e., the portion of the shallow grade layer 28 formed between the middle point Y to the first edge Z in FIG. 11.) plays the main role to the characteristics of the high voltage MOS transistor.

In the manufacturing process shown in FIGS. 2 through 10, the LDD layers 46 are formed by the ion implantation using the resist mask 62 that partially exposes the first active area 16a for forming the high voltage MOS transistor 20 in the process shown in FIG. 6. Further, the heavily doped source and drain layers 30 are formed by the ion implantation using the resist mask 66 formed using the same photo-mask in the process shown in FIG. 10. Therefore, the portion of the shallow grade layer 28, which overlaps the heavily doped drain area 30, contains both the implanted impurities in the process of FIG. 7 for forming the shallow grade layers 28, and those for forming the LDD layers 46 in the process of FIG. 6, although the portion of the shallow grade layer 28 that overlaps the heavily doped drain layer 30 is not shown in FIG. 11. Therefore, the shallow grade layer 28 has a higher concentration of impurities in the area overlapped with the heavily doped drain layer 30 compared with the area formed between the gate edge X and the first edge Z of the heavily doped drain layer 30. However, the implantation doses in the processes of FIGS. 6 and 7 are far smaller than those for forming the heavily doped source and drain layers 30 in the process of FIG. 10. Therefore, the peak concentration of the shallow grade layer 28 is still lower than that of the heavily doped drain layer 30, even in the area overlapped with the heavily doped drain layer 30.

In the exemplary manufacturing process shown in FIGS. 2 through 10, there is a possibility of the occurrence of a relative shift (or discrepancy) of the positions of the resist pattern 62 used for forming the LDD layers 46 in the process of FIG. 6, and that of the resist pattern 66 used for forming the heavily doped source and drain layers 30 in the process of FIG. 10, because of the alignment error between the two masks. In this case, there is a possibility that impurities for forming in the LDD layer 46 are also implanted in the area outside of the first edge Z of the heavily doped drain layer 30. As a result, the concentration of N-type impurities in the vicinity of the surface of the first active area 16a adjacent to the first edge Z of the drain layer 30 becomes higher than that at the gate edge X, even if the process for forming the shallow grade layer 28 is not performed in FIG. 7.

However, in order to improve the maximum operating voltage of the high voltage MOS transistor 20, it was found to be necessary to perform the process in FIG. 7 for forming the shallow grade layer 28. That is, within the range of experiments, the maximum operating voltage was not improved by the miss-alignment of the resist patterns.

The reason is thought be as follows: in order to improve the maximum operating voltage, it is necessary to increase the concentration of the impurities in the area adjacent to the first edge Z of the heavily doped drain area 30. Even if the area where impurities for forming the LDD layer 46 is implanted into the area adjacent to the first edge Z of the heavily doped drain layer 30 by the mis-alignment of the resist patterns, the width is about 0.1 µm at most. It is thought that the maximum operating voltage is not improved when the concentration of the impurities of only such an extremely narrow area adjacent to the first edge Z is increased.

On the other hand, the arrangement of the shallow grade layer 28 is determined by the masks in the high voltage MOS transistor 20 of the semiconductor device manufactured by the exemplary method shown in FIGS. 2 through 10. That is, the shallow grade layer 28 is formed by two masks. One mask is the mask for forming the resist pattern 60 for patterning the 1st gate insulation film 22 in the process in FIG. 3. The other mask is the mask for forming the resist pattern 66 for forming the heavily doped source and drain layers 30 in the process of FIG. 10. The shallow grade layer 28 is formed by these two masks and has a specified width between the middle point Y and the first edge Z. Therefore, the width is not smaller than the design rule of the manufacturing process of the semiconductor device 1. For example, when the design rule of the manufacturing process is 0.35 µm, the width is 0.35 µm or more. Alternatively, the width is not smaller than the minimum size of the gate electrode 44 of the low voltage MOS transistor 40.

According to various exemplary embodiments, the width of the shallow grade layer 28 depends on the impurity concentration of the shallow grade layer 28, the required breakdown voltage, and the like. However, in general, it is desirable to form the shallow grade layer 28 with the width from the middle point Y to the first edge Z of the heavily doped drain layer 30 of about 0.3-1.5 µm, as previously stated. The width of the shallow grade layer 28 should preferably be at least 0.3 µm or more, more preferably be over 0.5 µm or more, or further preferably be 1.0 µm or more. Moreover, in the high voltage MOS transistor 20 of the exemplary semiconductor device according to the present invention, the first gate insulation film 22 is patterned so that it is removed in the area corresponding to the shallow grade layer 28, as shown in FIG. 11. Such a structure is formed by implanting ions to the opening formed by patterning the first gate insulation film 22, and forming the shallow grade layer 28 using the pattern first gate insulation film 22 as a mask.

However, the position of the edge of the shallow grade layer 28 positioned between the gate edge X and the first edge Z of the drain layer 30 (the left edge in FIG. 11) and the position of the edge of the patterned first gate insulation film may not be completely the same in the high voltage MOS transistor 20 after the completion of the manufacturing of the semiconductor device. It is because the impurities of the shallow grade layer 28 diffuse to the horizontal direction during the heat treatment, and/or the edge of the patterned first gate insulation film is etched during the etching and/or cleaning process after the implantation process.

In the example of high voltage MOS transistor 20 in the exemplary semiconductor device according to the present invention shown in FIG. 11, the first gate insulation film 22 is removed in the area corresponding to the shallow grade layer 28, and the thickness of the first gate insulation film decreases at the area outside of the side wall spacer 34. This shape is not indispensable for the high voltage MOS transistor 20 of the semiconductor device according to the present invention. However, such a shape is formed by a partial etching of the first gate insulation film 22 during the etched for forming the side wall spacer 34 using the method explained in FIGS. 2 through 10.

Also, in the example of the high voltage MOS transistor 20 of the exemplary semiconductor device according to the present invention shown in FIG. 11, a step S is formed on the surface of the first active area 16a. The step S is located at the position corresponding to the edge Y of the shallow grade layer 28 between the gate edge X and the first edge Z of the drain layer 30. The surface of the first active area 16a is lowered toward the outer side or the side where the shallow grade layer 28 is formed (the right side in FIG. 11) of the step S. The step S is not indispensable for the high voltage MOS transistor 20 of the exemplary semiconductor device according to the present invention. However, the step S is formed by oxidizing the exposed surface of the first active area 16a in order to form the second gate insulation film 42 of the low voltage MOS transistor 40 after patterning the first gate insulation film 22 using the method explained in FIGS. 2 through 10.

In addition, the depth of the shallow grade layer 28 of the high voltage MOS transistor 20 of the exemplary semiconductor device 1 according to the present invention is formed far shallowly compared with the middle concentration layer disclosed in references 1 and 2. That is, the peak of the impurity concentration of the shallow grade layer 28 exists at a position that is shallower than the depth of the heavily doped drain layer 30. The details are explained below with reference to FIG. 12.

Figure 12:
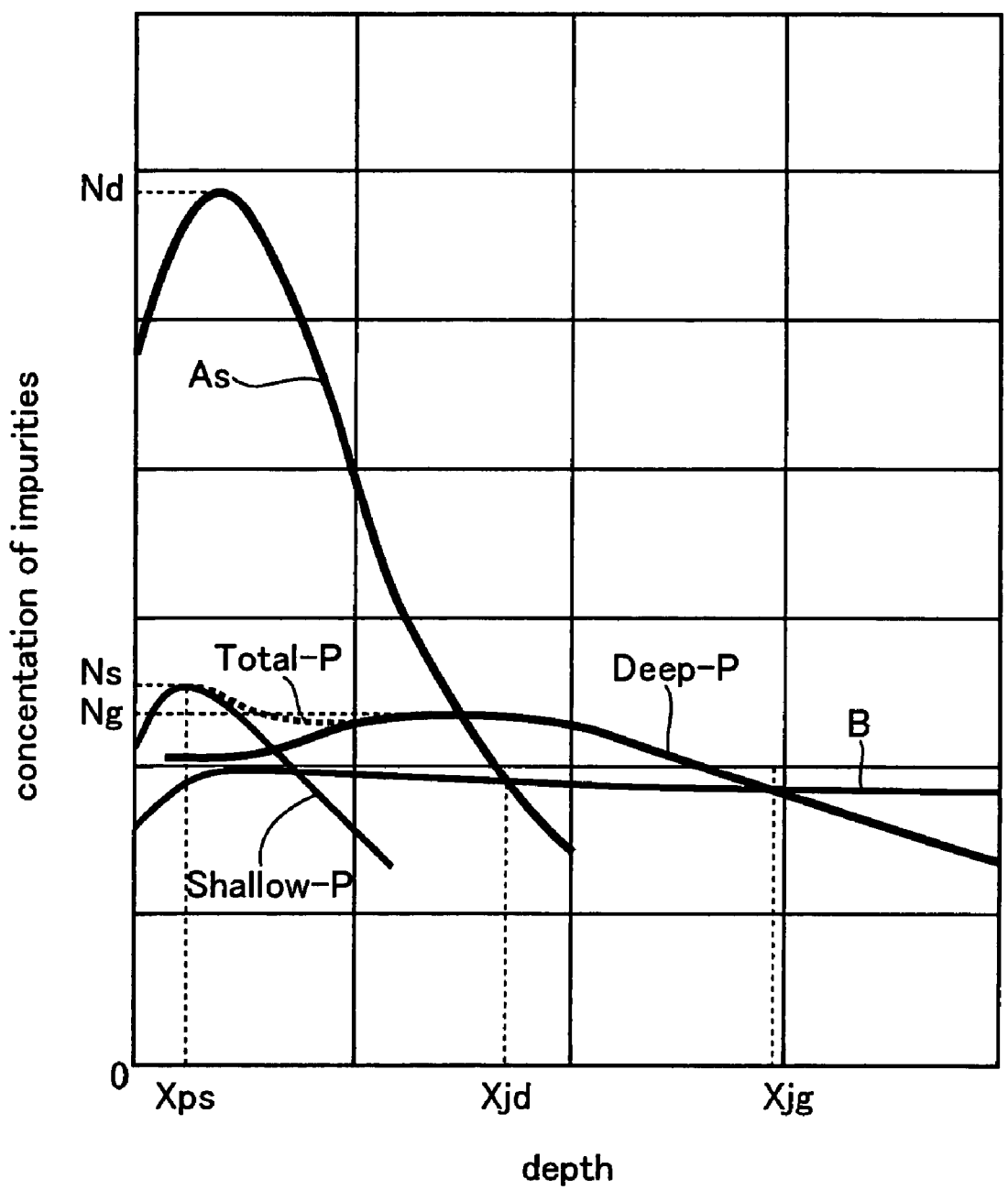
FIG. 12 is a distribution of the concentration of impurities in the P-type well area, the deep grade area and the shallow grade area at the cross-section of A-A' and that of the heavily doped drain area at the cross-section of B-B' of FIG. 11.

FIG. 12 shows distributions of impurities in the depth direction in one example of the transistor 20 of the exemplary semiconductor device according to the present invention at the cross-section A-A' shown in FIG. 11, where the shallow grade layer 28 is formed in the deep grade layer 26. Specifically, the distribution of boron doped in the P-type well area 12 as the P-type impurity, and the distribution of phosphorus doped in the deep grade layer 26 as the N-type impurity are shown. FIG. 12 also shows the distribution of arsenic doped in the heavily doped drain layer 30 as the N-type impurity at the cross-section B-B' shown in FIG. 11 where the heavily doped drain layer 30 formed in the deep grade layer 26.

The vertical axis of FIG. 12 shows the concentration of each impurity (logarithm scale), and the horizontal axis shows the depth from the surface of the first active area 16a. As for phosphorus, the concentrations of phosphorus implanted for forming the deep grade layer 26 (shown as "Deep-P" in FIG. 12) and the concentration of phosphorus implanted for forming the shallow grade layer 28 (shown as "Shallow-P" in FIG. 12) are shown separately in solid line. Furthermore, the total concentration of both phosphorus grade layers (shown as "Total-P" in FIG. 12) is shown in broken line.

As shown in FIG. 12, the concentration of boron (B) doped as the P-type impurity in the P-type well area 12 is almost constant within the figured range, i.e., within the depth that the deep grade layer is formed. The distribution of boron is substantially the same in all of the positions near the gate edge X shown in FIG. 11, where only the deep grade layer 26 is formed, at the cross-section B-B', and at the cross-section A-A'. Regarding the distribution of the arsenic (As) doped as the N-type impurity of the heavily doped drain layer 30, the peak of the concentration exists in the vicinity of the surface, and the peak concentration is far higher compared with the concentration of boron in the P-type well area 12. Beyond the peak, the arsenic concentration decreases rapidly to the concentration lower than the boron concentration in the P-type well 12. The depth Xjd, where the concentration of arsenic is equal to the boron concentration in the P-type well 12, is the depth of the heavily doped drain layer.

On the other hand, the concentration of Deep-phosphorus, which is the N-type impurities of the deep grade layer 26, is higher than the concentration of boron in P-type well area 12, from the surface to the depth that is deeper than the heavily doped drain layer. The depth Xjg, where the concentration of the Deep-phosphorus is equal to that of boron in the P-type well area 12, is the depth of the deep grade layer. Xjg is larger than Xjd. That is, the heavily doped drain layer 30 is formed within the shallow grade layer 28 in the direction of depth. However, the peak concentration of the Deep-phosphorus Ng is far lower than the peak concentration of arsenic Nd in the heavily doped drain layer. That is, the N-type impurity concentration of the deep grade layer 26 is lower than that of the heavily doped drain layer 30. The deep grade layer 26 is formed only with the Deep-phosphorus in the vicinity of the gate edge X shown in FIG. 11. Therefore, the concentration of N-type impurities in the vicinity of the surface of the first active area 16a can be lowered, and the maximum operating voltage at low gate voltage can be increased.

On the other hand, the shallow grade layer 28 is formed in the deep grade layer 30 in the area adjacent to the first edge Z of the heavily doped drain layer 30 as shown in FIG. 11. Therefore, in the vicinity of the surface of the first active area 16a, the Shallow-phosphorus for forming the shallow grade layer 28 is also contained in addition to the Deep-phosphorus for forming the deep grade area 26 in the area adjacent to the first edge Z. The Shallow-phosphorus is distributed in the vicinity of the surface having a peak at a more shallow position compared to the deep grade layer 30. In the vicinity of the surface, the concentration of Shallow-phosphorus is higher than that of the Deep-phosphorus at the same depth. Therefore, the total concentration of phosphorus (Total-P), which is the total of the Deep-phosphorus and the Shallow-phosphorus, has a peak at the vicinity of the surface (Xps). Therefore, the concentrations of N-type impurities in the vicinity of the surface of the first active area 16a is higher at the position adjacent to the first edge Z of the drain layer 30 compared to the concentration at the gate edge X. As a result, the maximum operating voltage at high gate voltages can be increased. However, the peak concentration of phosphorus in the shallow grade layer 28 Ns is far lower compared to the peak concentration of the arsenic in the heavily doped drain layer Nd. That is, the impurity concentration of the shallow grade layer 28 is lower compared to that of the heavily doped drain layer 30.

The distribution of phosphorus shown in FIG. 12 is at the cross-section of A-A' shown in FIG. 11, where the heavily doped drain layer 30 is not formed. At the cross-section of B-B' shown in FIG. 11 where the heavily doped drain layer 30 is formed, due to the crystal defects that occurred with the arsenic implantation, phosphorus may diffuse more rapidly during the heat-treatment performed afterwards, and the phosphorus may diffuse more deeply than compared with the distribution shown in FIG. 12. As a result, it may be possible that the position of the peak of phosphorus in the shallow grade layer 28 moves to a deeper position. Moreover, the implantation of phosphorus for forming the LDD layer 46 is also performed at the cross-section of B-B where the heavily doped drain layer 30 is formed.

However, in the various evaluated examples of the high voltage MOS transistor of the exemplary semiconductor device according to the present invention, the peak concentration of phosphorus exist at a shallow position even at the cross-section of B-B' compared with the depth of the heavily doped drain layer. It is important to form the LDD layer 46 shallowly in order to minimize the dimension and to improve the performance of the low voltage MOS transistor, which is formed on the same semiconductor substrate with the high voltage MOS transistor. Therefore, in the various evaluated examples, the phosphorus implantation for forming the LDD layer 46 in the process in FIG. 6 was performed with lower energies compared to the energy of phosphorus implantation for forming the shallow grade layer 28 in the process of FIG. 7

It was previously thought to be necessary to increase the impurity concentration in the deeper layer compared with the depth of the heavily doped drain layer in order to improve the maximum operating voltage at high gate voltages, as shown in, for example, reference 2. That is, the breakdown voltage at high gate voltages was thought to be determined by the electric field intensively at the bottom of the heavily doped drain layer. Accordingly, it was previously thought to be necessary to increase the impurity concentration in the deep layer at the bottom of the heavily doped drain layer in order to improve the breakdown voltage.

However, contrary to the prior belief, it was revealed to be possible to improve the maximum operating voltage at high gate voltages to a practically sufficient level by forming the shallow grade layer having the peak concentration at a shallower layer compared with the depth of the heavily doped drain layer 30, as shown in FIGS. 11 and 12. The mechanism that improves the maximum operating voltage at high gate voltages by forming the shallow grade area having the peak concentration in the shallow position is not yet clearly known. However, in the various examined high voltage MOS transistors 20 of the breakdown voltage of about 18V, it is considered that the electric field intensity at the vicinity of the surface adjacent to the drain layer 30 determines the maximum operating voltage at high gate voltages. That is, it is considered that the shallow grade layer 28 having the peak concentration at the shallow position increases the impurity concentration and reduces the electric field intensity in the vicinity of the surface of the active area adjacent to the heavily doped drain layer 30 and increases the maximum operating voltage at high gate voltages.

However, forming the shallow grade layer to have a peak concentration at the shallow position may not be indispensable to improve the maximum operating voltage at high gate voltages. That is, the maximum operating voltage at high gate voltages may also be improved even when the shallow grade layer is formed to have the peak concentration in a deeper position, and the impurity concentration is increased at the position adjacent to the bottom of the heavily doped drain layer by appropriately setting the impurity concentration in the shallow grade layer.

As shown in FIGS. 2 through 10, the impurities for forming the shallow grade layer inevitably distribute at the shallow position immediately after the implantation if the shallow grade layer is formed by the ion implantation with the energy that does not permit penetrating the first gate insulation film 22. Even in this case, it is possible to form the shallow grade layer that increases the impurity concentration in the area adjacent to the bottom of the heavily doped drain layer. For example, using arsenic for forming the heavily doped drain layer, and by using phosphorus, which diffuses rapidity compared with arsenic, for forming the shallow grade area, the impurity distribution in the shallow grade layer may be adjusted by adjusting the heat-treatment condition after the implantation.

However, a long time heat treatment at high temperature is needed in order to form the shallow grade area having such impurity distribution. This heat treatment is commonly applied to the low voltage MOS transistor formed on the same semiconductor substrate. Therefore, it is difficult to form a low voltage MOS transistor with small dimensions and a high performance. Therefore, it is desirable to form the shallow grade layer to have a peak concentration at a shallower position compared to the depth of the heavily doped drain layer 30, as shown in FIG. 11 and FIG. 12. Thereby, it is possible to form the shallow grade layer may with a low-cost and to form the semiconductor integrated circuit in which the low voltage MOS transistor with small dimensions and a high performance is integrated on the same semiconductor substrate, according to the manufacturing process shown in FIGS. 2 through 10.

EXAMPLE

A high voltage MOS transistor 20 of the exemplary semiconductor device 1 according to the present invention having the shallow grade layer is formed by using the manufacturing process shown in FIGS. 2 through 10 and the characteristics of the high voltage MOS transistor 20 are evaluated.

Figure 13:
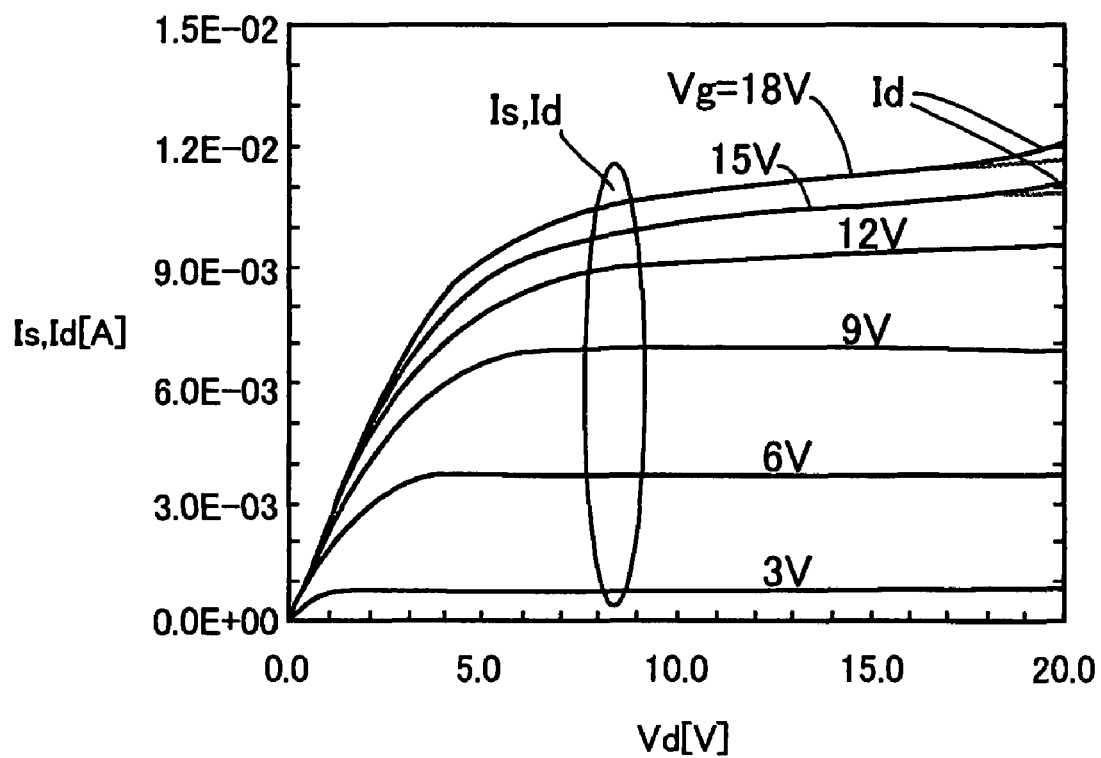
FIG. 13 is a graph of the characteristic of a high voltage MOS transistor that composes the semiconductor device of the present invention in which the shallow grade area is formed.

FIG. 13 shows the relationship between the drain current Id, the source current Is of the high voltage. MOS transistor, which has the shallow grade layer 28, and the drain to source voltage Vd. The heavily doped drain layer is formed about 1.5 µm away from the gate edge. The shallow grade layer is formed by implanting phosphorus ions with a dose of ⅕ compared with the dose for forming the deep grade layer. The width of the shallow grade layer formed at the side of the heavily doped drain layer i.e., the width between the point Y and the first edge Z shown in FIG. 11 is about 1.0 µm. In FIG. 13, a slight discrepancy between the source current and the drain current is observed only in the range of the drain-source voltage of 18V or more and the gate voltage of 15V or more. However, this small discrepancy is within the acceptable range, and the transistor may be operated as a high voltage MOS transistor with the breakdown voltage of 18V.

COMPARATIVE EXAMPLE

Figure 14:
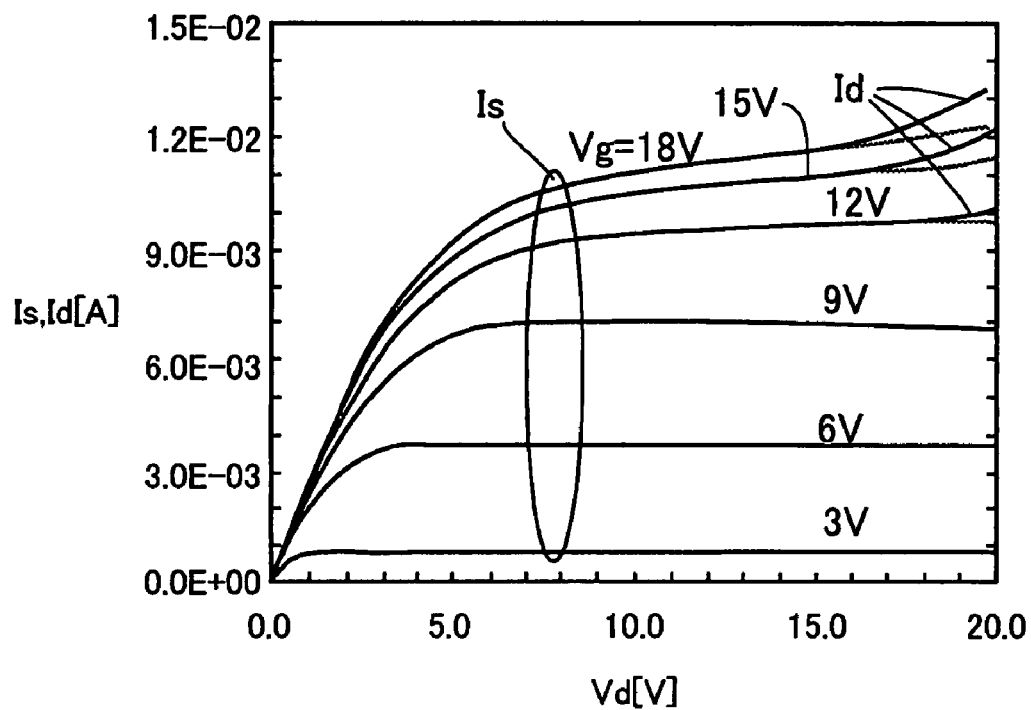
FIGS. 14 and 15 are graphs of the characteristic of a high voltage MOS transistor that composes a conventional semiconductor device in which no shallow grade area is formed.
Figure 15:
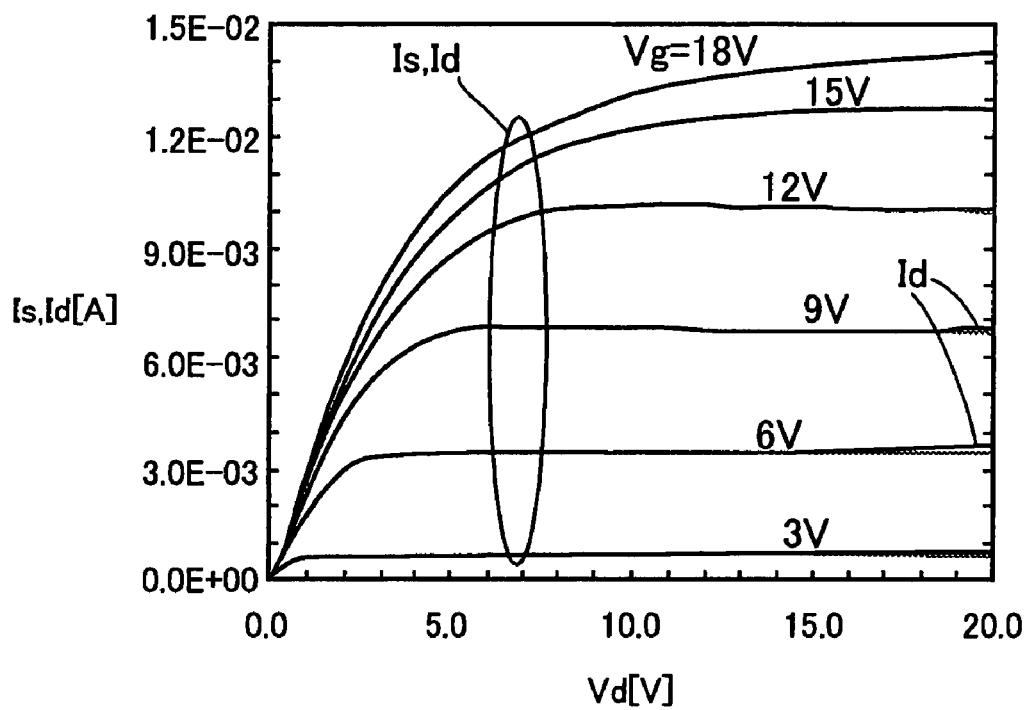

A high voltage MOS transistor is formed similarly to the above mentioned example except that the shallow grade layer is not formed, and that the dose of phosphorus ion implantation for forming the deep grade layer is increased by 25% compared with that of the example transistor. FIG. 14 shows the characteristic of the transistor of the comparative example. A large discrepancy between the source current and the drain current is observed in the range of the drain-source voltage of 18V or more and the gate voltage of 15V or more. Therefore, when operating at high gate voltages, the transistor of the comparative experiment may not operate as a high voltage MOS transistor with the breakdown voltage of 18V. Moreover, another high voltage MOS transistor is formed by further increasing the dose of the ion implantation for forming the deep grade layer by 20%. FIG. 15 shows the characteristic of another transistor of the comparative example. In this case, the discrepancy between the source current and the drain current is observed in the range of the gate voltage of 9V or less. Therefore, when operating at low gate voltages, the transistor of another comparative example may not operate as a high voltage MOS transistor with a breakdown voltage of 18V.

From the above mentioned evaluations, it is clearly understood that, by forming a shallow grade layer, it is possible to increase the maximum operating voltage both at high and low gate voltages in the high voltage MOS transistor of the exemplary semiconductor device according to the present invention. Moreover, it is possible to manufacture the shallow grade layer without requiring any different photo masks and, furthermore, without requiring any additional mask process in the manufacturing process of the exemplary semiconductor device according to the present invention. As explained above, according to various exemplary manufacturing processes of the semiconductor device according to the present invention, the semiconductor device including a high voltage MOS transistor that has the shallow grade layer and has a high maximum operating voltage can be manufactured at low cost without requiring a different photo mask, nor requiring a separate mask process for forming the shallow grade layer. Furthermore, various exemplary semiconductor devices according to the present invention, which have the shallow grade layers and have the high maximum operating voltage, can be manufactured from such a low-cost manufacturing process.

The invention is not limited to the aforementioned examples, and various modifications or improvements may be made within the spirit of the present invention. For example, in the exemplary high voltage MOS transistor 20 shown in FIG. 1, the drain side and the source side are formed symmetrically. However, it is not indispensable for the semiconductor device according to the present application to have a symmetric structure. For example, when one side is determined to be used as the drain, it is possible to form the deep grade layer and the shallow grade layer only on the drain side.

Moreover, in the exemplary manufacturing method shown in FIGS. 2 through 10, the heavily doped drain layer is formed by using the resist pattern 66. As shown in FIG. 10, the resist pattern 66 exposes the central portion of the opening 36 formed by patterning the first gate insulation film 22 and covers peripheral portions of the opening 36 on the both sides, i.e., the sides near and far from the gate edge. It is necessary to form the heavily doped drain area 30 by using the mask that covers the peripheral portion of the opening 36 near the gate edge in order to form the shallow grade layer 28 in the area adjacent to the first edge Z of the heavily doped drain layer 30, as shown in FIG. 11. However, it is not indispensable to use a mask that covers the peripheral portion of the opening 36 away from the gate edge.

What is claimed is:

1. A semiconductor device containing a MOS transistor on a semiconductor substrate comprising:
   a gate insulation film formed on a surface of an active area in a surface of said semiconductor substrate, the active area having a first conduction type;
   a gate electrode formed on said gate insulation film and having sidewalls;
   a first sidewall film formed on each sidewall of the gate electrode;
   deep grade layers of a second conduction type formed in the surface of the active area at both sides of the gate electrode, each of the deep grade layers extending outwardly from a gate edge;
   a drain layer of said second conduction type formed in a surface of the deep grade layer, the drain layer being doped heavier compared with said deep grade layer, the drain layer extending outwardly from a first edge positioned away from said gate edge; and
   a shallow grade layer of said second conduction type formed in a portion of the surface of the deep grade layer from a middle point, which is located between the gate edge and the first edge and spaced laterally apart from the first sidewall film, to the first edge of the drain layer, the shallow grade layer being lightly doped compared with the drain layer, wherein the shallow grade layer increases a concentration of impurities of said second conduction type in the vicinity of the surface of said active area adjacent to the first edge of the drain layer compared with the concentration at the gate edge.

2. A semiconductor device according to claim 1, wherein the surface of the active area has a step at a position corresponding to the middle point such that the surface of the active area is lowered toward an outer side of the step.

3. A semiconductor device according to claim 1, further comprising a second MOS transistor, the second MOS transistor having:
   a second gate electrode formed on a second gate insulation film and having sidewalls, the second gate insulation film being thinner than said gate insulation film and formed on a surface of a second active area of said first conduction type in the surface of said semiconductor substrate;
   a second sidewall film formed on each sidewall of the second gate electrode; and
   a second drain layer of said second conduction type formed in the surface of the second active area, the second drain layer extending outwardly from a position corresponding to an outer edge of the second sidewall film.

4. The semiconductor device according to claim 3, wherein the first sidewall film and the second sidewall film are formed simultaneously.

5. A semiconductor device containing a MOS transistor formed using a manufacturing process on a semiconductor substrate comprising:
   a gate insulation film formed on a surface of an active area in a surface of the semiconductor substrate, the active area having a first conduction type;
   a gate electrode formed on the gate insulation film and having sidewalls;
   a first sidewall film formed on each sidewall of the gate electrode;
   a deep grade layer of a second conduction type formed in the surface of the active area, the deep grade layer extending outwardly from a gate edge;
   a drain layer of said second conduction type formed in a position of the surface of said deep grade layer, the drain layer being doped heavier compared with said deep grade layer, the drain layer extending outwardly from a first edge positioned away from the gate edge; and
   a shallow grade layer of said second conduction type formed at a portion in the surface of the deep grade layer from a middle point, which is located between the gate edge and the first edge and spaced laterally apart from the first sidewall film, to the first edge of said drain layer, the shallow grade layer having a width not smaller than a design rule of the manufacturing process and being lightly doped compared with the drain layer, wherein the shallow grade layer increases a concentration of impurities of said second conduction type in the vicinity of the surface of said active area adjacent to the first edge of the drain layer compared with the concentration at the gate edge, and a peak of the concentration of the impurities in said shallow grade layer is located at a shallower position than a depth of said drain layer, wherein
   a peak concentration of the impurities in the shallow grade layer is higher than a peak concentration of impurities in the deep grade layer, and the peak concentration of the impurities in the shallow grade layer is lower than a peak concentration of impurities in the drain layer.

6. A semiconductor device according to claim 5, further comprising a second MOS transistor, the second MOS transistor having:
   a second gate electrode formed on a second gate insulation film and having sidewalls, the second gate insulation film being thinner than said gate insulation film and formed on a surface of a second active area of said first conduction type on the surface of said semiconductor substrate;
   a second sidewall film formed on each sidewall of the second gate electrode; and
   a second drain layer of said second conduction type formed in the surface of the second active area, the second drain layer extending outwardly from a position corresponding to an outer edge of the second sidewall film.

7. The semiconductor device according to claim 6, wherein the first sidewall film and the second sidewall film are formed simultaneously.

8. The semiconductor device according to claim 1, wherein the gate insulation film is left at an area outside of the first sidewall film and is removed in an area corresponding to said shallow grade layer.

* * * * *